(12) United States Patent
Buckingham et al.

(10) Patent No.: US 8,248,279 B2
(45) Date of Patent: Aug. 21, 2012

(54) HISTORY BUFFER APPARATUS AND METHOD FOR ADAPTIVE LOSSLESS DATA COMPRESSION

(75) Inventors: Jonathan Peter Buckingham, Bristol (GB); Andrew Hana, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 29 days.

(21) Appl. No.: 12/911,892

(22) Filed: Oct. 26, 2010

(65) Prior Publication Data

US 2012/0098681 A1    Apr. 26, 2012

(51) Int. Cl.
*H03M 7/30* (2006.01)
(52) U.S. Cl. .......................................... 341/87; 341/50
(58) Field of Classification Search .................. 341/51, 341/50, 67, 106, 55, 95, 87; 395/733, 601, 395/800.23
See application file for complete search history.

(56) References Cited

U.S. PATENT DOCUMENTS

| | | |
|---|---|---|
| 5,384,567 A | 1/1995 | Hassner et al. |
| 6,657,565 B2 | 12/2003 | Kampf |
| 7,180,433 B1 | 2/2007 | Grotmol |
| 7,233,265 B2 * | 6/2007 | Cockburn et al. ............... 341/51 |
| 7,492,290 B1 | 2/2009 | Schneider |
| 2005/0144415 A1* | 6/2005 | Doshi et al. ................... 711/173 |
| 2007/0154106 A1 | 7/2007 | Koziarz |
| 2009/0288059 A1 | 11/2009 | Dimou et al. |

* cited by examiner

*Primary Examiner* — Joseph Lauture (57) ABSTRACT

A history buffer for use in adaptive lossless data compression comprises a plurality of memory locations. The memory locations are partitioned into two or more segments, each segment configured to detect a match sequence independently of the other segments. Control logic is provided for controlling the detection of match sequences between the two or more segments.

20 Claims, 10 Drawing Sheets

HISTORY BUFFER APPARATUS AND METHOD FOR ADAPTIVE LOSSLESS DATA COMPRESSION

BACKGROUND

Data compression is a technique that enables data to be coded in order to minimize the number of bits required to represent the original data.

Adaptive lossless data compression (ALDC) is a technique, as the name suggests, that enables the compression to be performed in a dynamic manner without any data being lost, thus enabling the original data to be regenerated to exactly its original state during a decompression operation.

An ALDC system typically uses a content addressable memory (CAM), which comprises a history buffer that stores a dictionary of data sequences. Incoming file strings to be compressed are adaptively matched against the data stored in the history buffer, such that the original data is represented by a succession of matches with the dictionary.

Existing CAM based ALDC compression engines require match signals (or flags) to be created at each history buffer location. The match signals are often combined logically, for example OR'd together, with the result being used to drive out a control signal to all locations of the history buffer.

This means that in one clock cycle there can be a large fan-in of signals to an OR gate, and a large fan-out of signals back to all history buffer locations in a cascade arrangement. For compression engines with relatively small history buffers this does not present any issues. However, for large compression engines the large fan-in and fan-out can be disadvantageous.

For example, if the size of a history buffer is increased, for example from 1024 to 16384 bytes (i.e. a 16 times increase), current technology does not allow for fan-in and fan-out to be achieved in one cycle for such a history buffer.

BRIEF DESCRIPTION OF THE DRAWINGS

For a better understanding of the present invention, and to show more clearly how it may be carried into effect, reference will now be made, by way of example only, to the following drawings in which.

DETAILED DESCRIPTION

The implementations described in the examples below provide a method and apparatus for use in adaptive lossless data compression (ALDC), for example ALDC used with a content addressable memory (CAM) having a history buffer. Although the various implementations are described in relation to a CAM having a history buffer, it is noted that the implementations may be used with any buffer memory having a set of storage locations that are capable of receiving data that is to be matched, and that are capable of generating corresponding match flags.

A content addressable memory comprises a history buffer that stores a plurality of bytes, with incoming sequences being compared with those bytes which are stored in the history buffer.

Consider a history buffer of a content addressable memory that comprises the sequence shown in Table 1 below stored in locations 1 to 12:

TABLE 1

| | Location | | | | | | | | | | | | |
|---|---|---|---|---|---|---|---|---|---|---|---|---|---|
| | 0 | 1 | 2 | 3 | 4 | 5 | 6 | 7 | 8 | 9 | 10 | 11 | 12 |
| Contents | A | B | C | D | E | F | G | B | C | D | K | L | M |

As a first example, consider that an input sequence comprising the sequence A B C D is compared with the contents of the history buffer of Table 1 (i.e. an input sequence comprising A (first), then B, then C, then D). Such a sequence would correctly match at locations 0, then 1, then 2 and finally 3. This matching sequence would result in a "copy pointer" starting at address 0 lasting 4 bytes.

As a second example, consider that a new input sequence B C D E is compared with the contents of the history buffer of Table 1. Such a sequence would match as follows:

The in-coming B matches at location 1 and at location 7. Because no match sequence is currently in progress, both matches are maintained.

The in-coming C continues both sequences at locations 2 and 8.

The in-coming D continues both sequences at locations 3 and 9.

The in-coming E now continues only the one sequence at location 4.

This results in a copy pointer starting at location 1 and lasting 4 bytes.

As a third example, consider that a new sequence A B C D K L M is compared with the contents of the history buffer of Table 1. Such a sequence would match as follows:

The in-coming A matches at location 0

The in-coming B continues the matching sequence at location 1.

It will be noted that B also matches at location 7. However, the matching of B with location 7 is ignored because a match sequence has already been started at location 0. This is because no match can commence if an existing matching sequence continues. In other words, a new sequence is not allowed to start when there is a currently active matching sequence.

Thus, when considering the sequence A B C D K L M with the contents of the history buffer shown in Table 1, it can be seen that this received sequence results in a copy pointer starting at address 0 lasting 4 bytes. However, it can be seen that, had the matching sequence been started when B matched at location 7, then this would have resulted in a copy pointer starting at address 7 lasting 6 bytes (i.e. because the sequence B C D K L M matches with the contents of locations 7 to 12).

As such, the conventional hardware is not able determine that the sequence ABCD followed by KLM is a worse set of codewords than A followed by BCDKLM.

Figure 1:
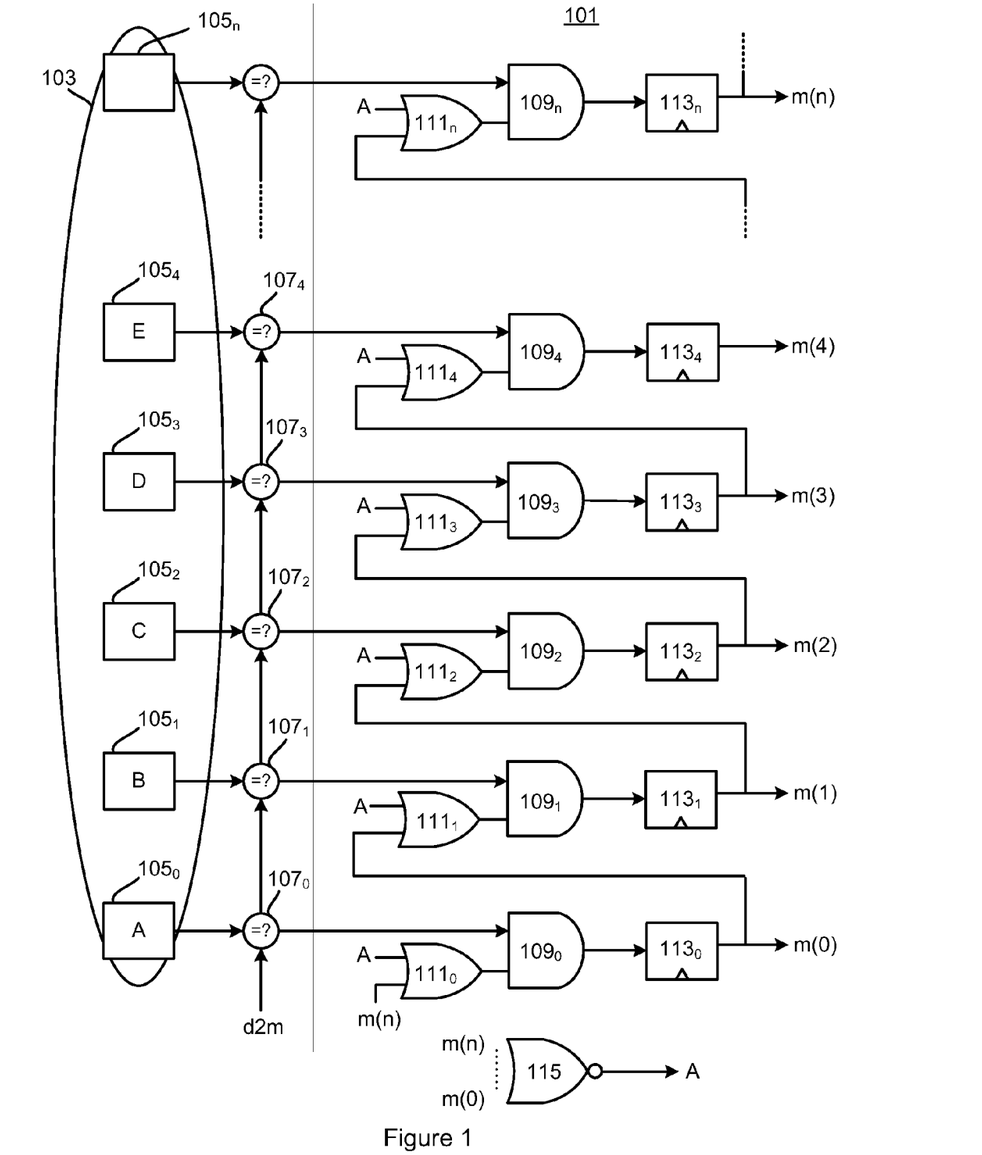
FIG. 1 illustrates an apparatus for use in adaptive lossless data compression using a content addressable memory.

FIG. 1 shows a simplified structure of an apparatus 101 for use in an adaptive lossless data compression scheme, for example with a content addressable memory comprising a history buffer 103. The history buffer 103 comprises a plurality of memory locations $105_0$ to $105_n$. In the example shown the history buffer 103 is illustrated as having the values A, B, C, D and E in memory locations $105_0$ to $105_4$. A plurality of comparison units $107_0$ to $107_n$ determine whether or not a value of an input sequence received on an input line d2m (i.e. data-to-match) matches a value of a corresponding memory location $105_0$ to $105_n$.

The apparatus 101 comprises a plurality of AND gates $109_0$ to $109_n$, each AND gate $109_0$ to $109_n$ coupled to receive the output of a corresponding comparison unit $105_0$ to $105_n$ on a first input. Each AND gate $109_0$ to $109_n$ is also coupled to receive the output of an OR gate $111_0$ to $111_n$ on its second input. Each OR gate receives a control signal "A" as a first input ("A" being termed an "ALLOW" signal in the art), and a match signal "m" of a preceding memory location (i.e. m(x−1)) on a second input. The first OR gate $111_0$ will have its second input coupled to the match signal m(n) of the last memory location $105_n$ in the history buffer 103, thus forming a "circular" arrangement. For example, for a 1024 element history buffer, match signal m(1023) will be coupled to the second input of OR gate $111_0$, the match signal m(n) thereby being the effective "preceding" match signal m(x−1). The apparatus 101 also comprises a plurality of delay units $113_0$ to $113_n$ (for example D-type Flip Flops). Each delay unit $113_0$ to $113_n$ is coupled to receive the output of a corresponding AND gate $109_0$ to $109_n$, and output a match signal m(0) to m(n).

A NOR gate 115 receives the plurality of match signals m(0) to m(n) and generates the control signal A (i.e. which is coupled to the first input of each OR gate $111_0$ to $111_n$).

The operation of the circuit shown in FIG. 1 will be described in relation to FIGS. 2 and 3 below.

Figure 2:
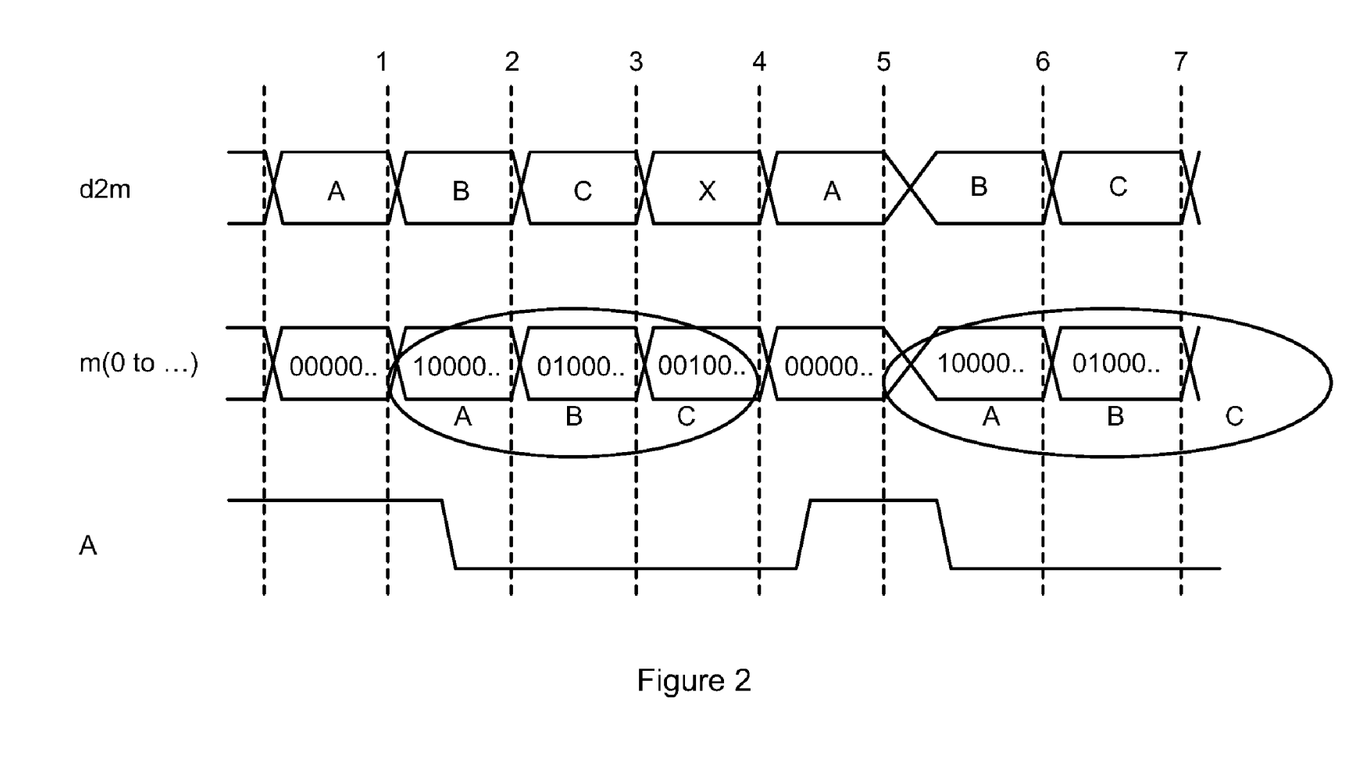
FIG. 2 shows timing diagrams relating to the operation of the circuit shown in FIG. 1 in response to an example of a first input sequence.

Referring to FIG. 2, consider that the following sequence is received on the input line d2m:
  Before edge 1, all of the match signals m(0) to m(n) will be at 0. As a consequence, the NOR gate 115 outputs a 1, i.e. such that the control signal A is at 1. A new match sequence is therefore allowed to commence when the control signal A is at 1.
  On edge 1 where the value on the input line d2m is A, then the comparison unit $107_0$ detects a match, which in turn results in the AND gate $109_0$ receiving logic 1 on both inputs, which results in the match signal m(0) being set to 1.
  Because the match signals m(0) to m(n) are no longer all at zero, the output of the NOR gate 115 (i.e. the control signal A) goes to logic 0. This prevents any new matches from starting.
  On edge 2 where d2m comprises value B, then the match signal m(1) is set to 1. It will be noted that although the control signal A on the first input of the OR gate $111_1$ will be 0, the second input of the OR gate $111_1$ will be 1 (i.e. because m(0) is 1), such that the match signal from comparison unit $107_1$ can propagate via the delay unit $113_1$ to provide the match signal m(1).
  In a similar manner to the above, on edge 3 for input C, then the match signal m(2) is set to 1.
  However, on edge 4 when value X is present on d2m, then the match sequence stops, such that no further match signals m are set. In other words, the output of comparison unit $107_3$ is 0, which results in the match signal m(3) being 0, which in turn causes the NOR gate 115 to become 1, resulting in the control signal A becoming 1.

It can be seen that the match signal bus (the m-bus) has identified a 3-byte sequence, starting at location 0 and ending at location 2.

On edge-5, the process starts over.

Figure 3:
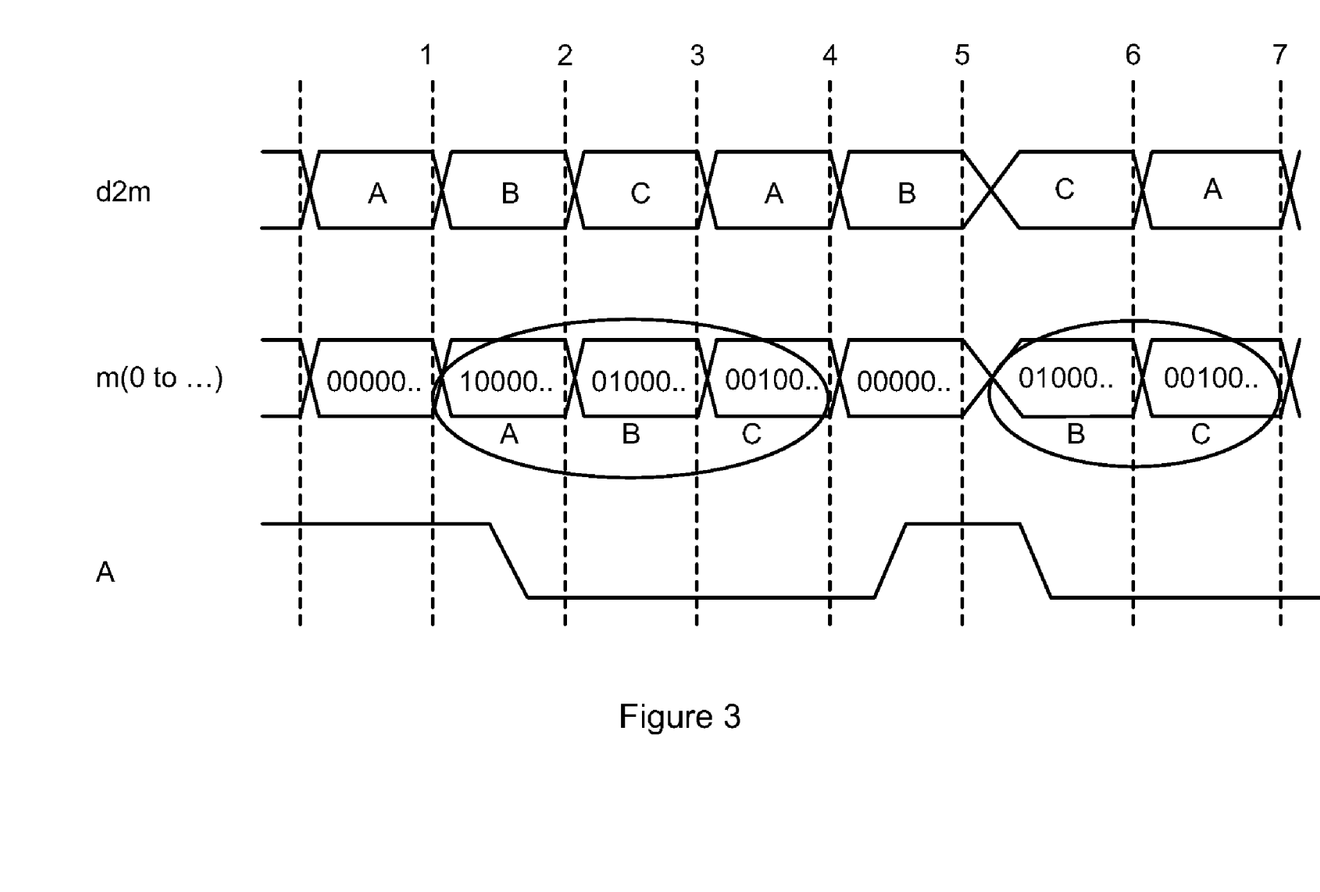
FIG. 3 shows timing diagrams relating to the operation of the circuit shown in FIG. 1 in response to an example of a second input sequence.

Referring to FIG. 3, now consider that the following sequence A B C A B C is received on the input line d2m:
  The same procedure as described above applies to edges 1 to 3.
  However, with this particular sequence, on edge 4, the match sequence ends such that the match signal m returns to 0.
  Although input A matches at address 0, because the control signal A is at 0 and there is no incoming match from below, the match signal m(0) does not become set.
  On edge 5, because the control signal A is at 1, then the circuit starts the match sequence B C.

It can therefore be seen that the arrangement of FIG. 1 is not well suited for detecting the sequence A B C A B C.

Figure 4:
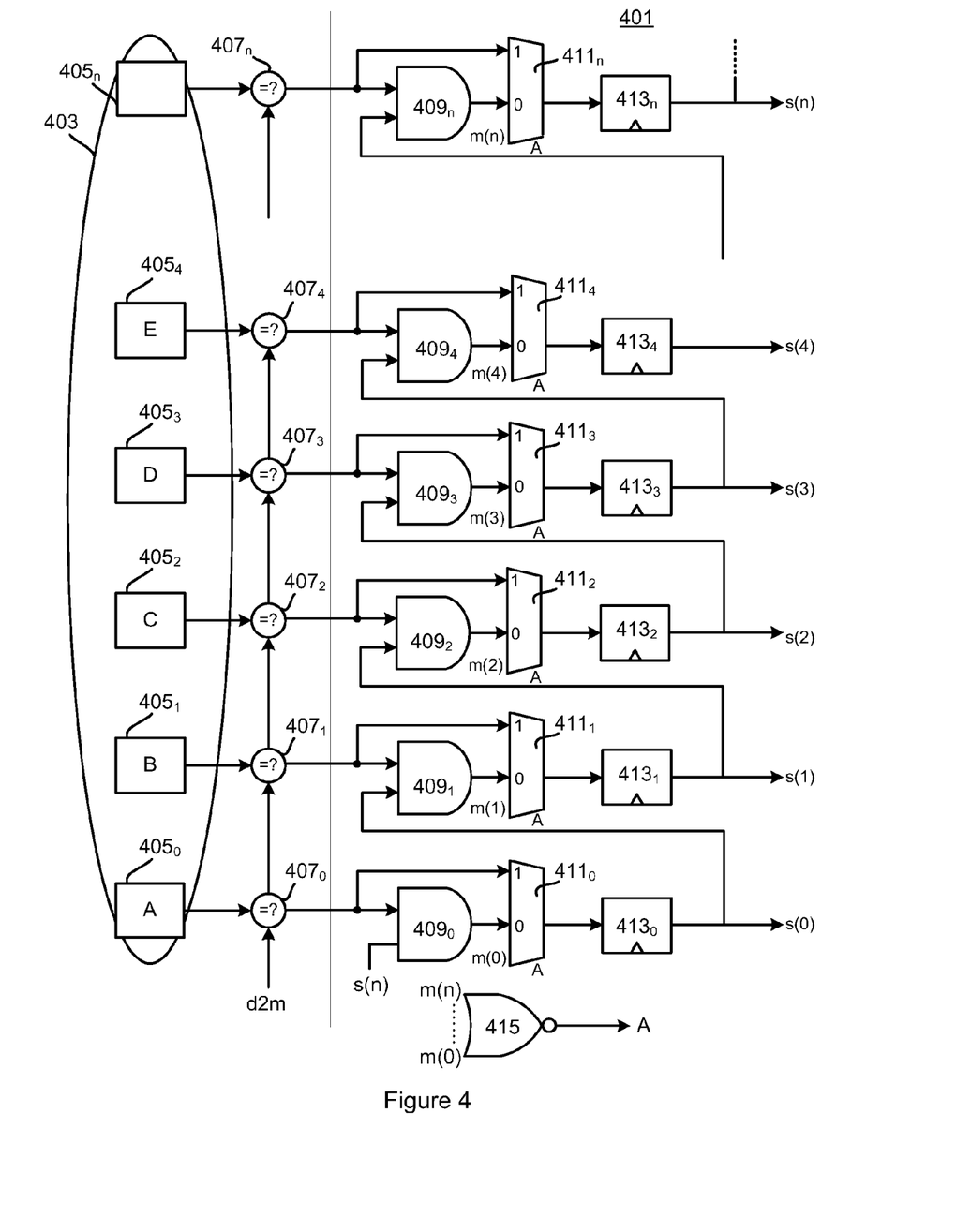
FIG. 4 illustrates another example of an apparatus for use in adaptive lossless data compression using a content addressable memory.

FIG. 4 shows an arrangement having more combinatorial logic for solving this problem.

A history buffer 403 is shown as having a plurality of memory locations $405_0$ to $405_n$. In the example, the history buffer 403 is illustrated as having the values A, B, C, D and E in memory locations $405_0$ to $405_4$. A plurality of comparison units $407_0$ to $407_n$ each determine whether or not a value of an input sequence received on an input line d2m matches a value of a corresponding memory location $405_0$ to $405_n$. The apparatus 401 comprises a plurality of AND gates $409_0$ to $409_n$, each AND gate $409_0$ to $409_n$ coupled to receive the output of a corresponding comparison unit $405_0$ to $405_n$ on a first input. Each AND gate $409_0$ to $409_n$ is also coupled to receive a sequence signal s(x−1) of a preceding memory location on its second input. The first AND gate $409_0$ will have its second input coupled to the sequence signal s(n) of the last memory location $405_n$ in the history buffer 403, thus forming a "circular" arrangement. For example, for a 1024 element history buffer, sequence signal s(1023) will be coupled to the second input of AND gate $409_0$, the sequence signal s(n) thereby being the effective "preceding" sequence signal s(x−1).

The apparatus 401 further comprises a plurality of multiplexer units $411_0$ to $411_n$. Each multiplexer unit $411_0$ to $411_n$ is coupled to receive the output of a corresponding comparison unit $405_0$ to $405_n$ on a first input, and the output of a corresponding AND gate $409_0$ to $409_n$ on a second unit, the outputs of the AND gates $409_0$ to $409_n$ being the match signals m(0) to m(n). Each multiplexer unit $411_0$ to $411_n$ is controlled by a control signal A, and in the example passes the output of the corresponding AND gate $409_0$ to $409_n$, i.e. the match signal m(0) to m(n) when the control signal A is at 0, and passes the output of the corresponding comparison unit $405_0$ to $405_n$ when the control signal A is at 1.

The apparatus 401 also comprises a plurality of delay units $413_0$ to $413_n$ (for example D-type Flip Flops). Each delay unit $413_0$ to $413_n$ is coupled to receive the output of a corresponding multiplexing unit $411_0$ to $411_n$, and provide a corresponding sequence signal s(0) to s(n).

A NOR gate 415 receives the plurality of match signals m(0) to m(n) and generates the control signal A (i.e. which controls the multiplexer units 411$_0$ to 411$_n$).

If there are no matches at all, then the match signal bus (i.e. the m-bus) will be at 0 (i.e. all match signals m(0) to m(n) are at 0), which means that the NOR gate 415 sets the control signal A to 1. This condition allows any match to become registered as a sequence. However, once a match sequence starts, then the control signal A becomes 0, and as a consequence no new match sequences can start. Once the end of a match sequence is reached, then the control signal A will become 1 again.

Figure 5:
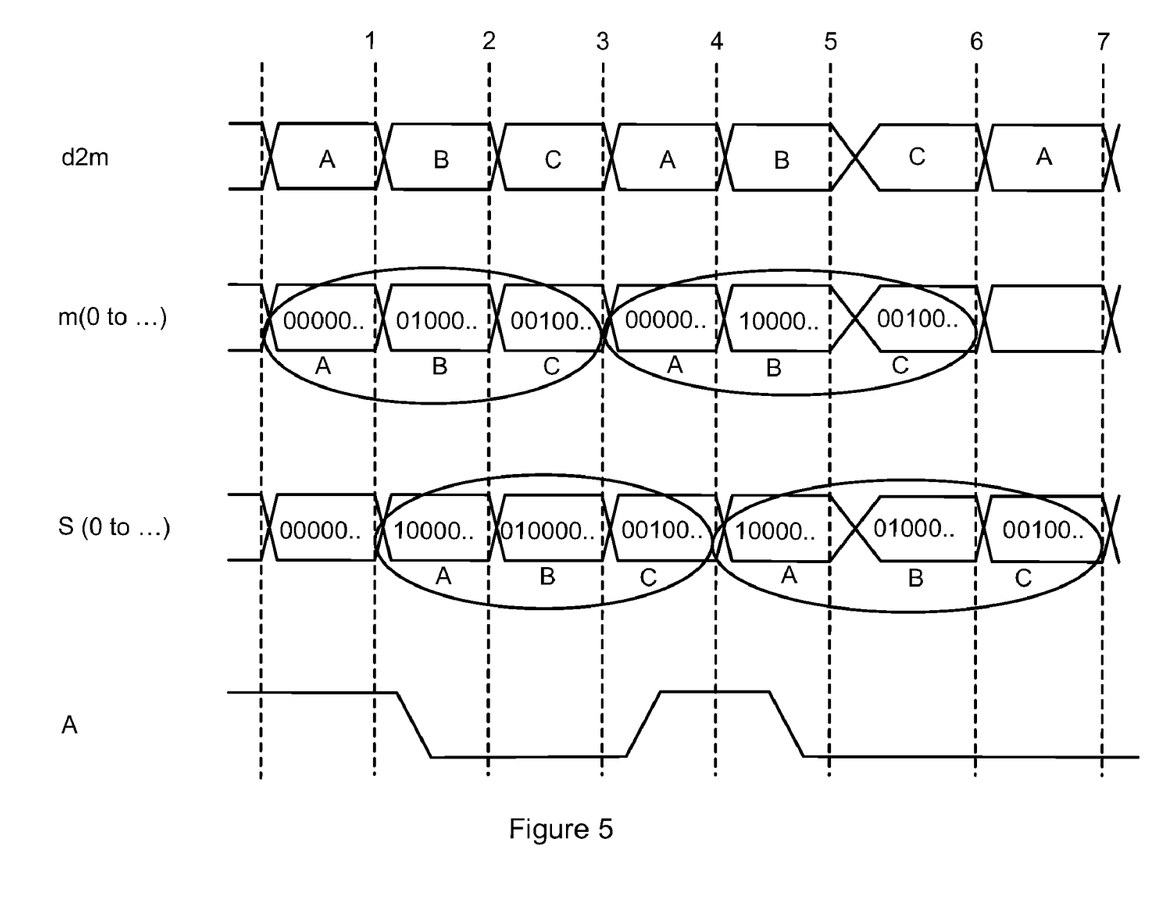
FIG. 5 shows timing diagrams relating to the operation of the circuit shown in FIG. 4 in response to an example of a first input sequence.

Referring to FIG. 5, it can be seen that the arrangement of FIG. 4 handles the input sequence example of A B C A B C (i.e. the same sequence as considered in FIG. 3) as follows:

On edge 1, there are no prior matches, and therefore the match signal bus m is at 0 and therefore the control signal A is at 1. Hence the incoming match goes through as sequence signal s(0).

On edge 2, the match signal m(1) is at 1, and because control signal A is 0 then only the existing sequence can propagate on to s(1).

On edge 3, the match signal m(2) is at 1, and because control signal A is 0 then only the existing sequence can propagate on to s(2).

On edge 4, the match signal m(3) does not become set, therefore the control signal A becomes 1 and a new match propagates into the delay units 413$_0$ to 413$_n$.

It is noted that the sequence bus (i.e. comprising sequence signals s(0) to s(n)) denotes match sequences:

if all of the sequence signals s(0) to s(n) are null, then all of the match signals m(0) to m(n) will be null, which results in the control signal A being 1 to allow new matches to start.

if any of the sequence signals s(0) to s(n) are non-null, then the match signals m(0) to m(n) will only be non-null for sequences that continue. For an input d2m that does not continue the sequence, then the match signals m(0) to m(n) will become null and the control signal A becomes 1 allowing new sequences to start.

It is noted that the arrangement shown in FIG. 4 therefore provides an improved compression result. However, this is at the expense of a large combinatorial chain, as follows:

1. the incoming sequence value on the signal line d2m must go to all locations of the history buffer 403. Each location generates its own bit of the match signal bus m.
2. The entire match signal bus m must be NOR'd using the NOR gate 415.
3. The output of the NOR gate 415 must then be distributed to all of the multiplexer units 411$_0$ to 411$_n$.

Such an arrangement has the disadvantage of having a large fan-in and a large fan-out that must be fanned-in and fanned-out in a cascaded arrangement within one clock cycle.

As mentioned in the background section, while a fan-in and fan-out of this type might be acceptable in a history buffer comprising 1,024 bytes, the fan-in and fan-out becomes more of an issue for a larger history buffer, for example a history buffer comprising 16,384 bytes.

Figure 6:
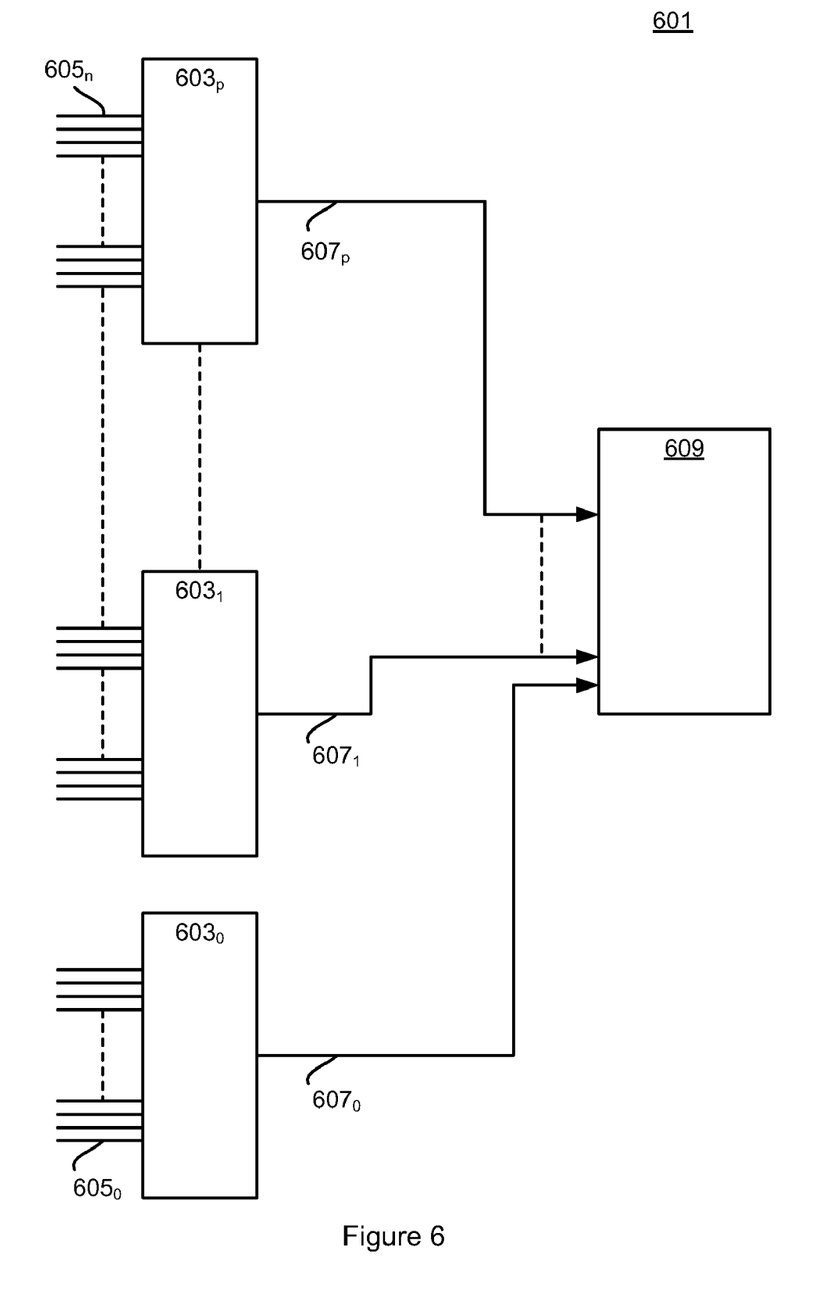
FIG. 6 shows an example of a history buffer according to one implementation.

FIG. 6 shows a history buffer 601 according to a first implementation. The history buffer 601 comprises a plurality of memory locations 605$_0$ to 605$_n$. The history buffer 601 is partitioned into a plurality of contiguous segments 603$_0$ to 603$_P$, each contiguous segment 603$_0$ to 603$_P$ being configured to handle a plurality of memory locations 605$_0$ to 605$_n$. For example, for a 16384 byte history buffer the contiguous segments 603$_0$ to 603$_P$ may comprise sixteen segments 603$_0$ to 603$_{15}$, each handling 1024 bytes. It is noted, however, that other configurations are possible, for example a history buffer having a different number of contiguous segments 603$_0$ to 603$_{15}$, each handling fewer or an increased number of bytes. It is also noted that at least one of the contiguous segments 603$_0$ to 603$_P$ may be configured to handle a different number of bytes to another of the contiguous segments 603$_0$ to 603$_P$.

During operation each incoming byte is written into the history buffer 601 in sequential address locations, i.e. sequentially from memory location 605$_0$ to memory location 605$_n$ (for example 0 ... 16383, 0 ... 16383, etc). Each contiguous segment 603$_0$ to 603$_P$ is configured to look for matches independently and in parallel with other contiguous segments 603$_0$ to 603$_P$. As such, the matching operation involving a fan-in and fan-out is carried out within each of the smaller contiguous segment 603$_0$ to 603$_P$, rather than across the entire history buffer 601. The number of memory locations handled by each contiguous segment 603$_0$ to 603$_P$ can therefore be chosen to provide a desired fan-in or fan-out. For example, the configuration of the contiguous segments 603$_0$ to 603$_P$ can be chosen such that a maximum fan-in or fan-out is not exceeded.

When matches are found, each contiguous segment 603$_0$ to 603$_P$ generates respective copy pointer signals 607$_0$ to 607$_P$. Control logic 609 is coupled to receive the copy pointer signals 607$_0$ to 607$_P$ from the plurality of contiguous segments 603$_0$ to 603$_P$. The control logic 609 is configured to select and prioritise the copy pointer signals 607$_0$ to 607$_P$, as will be described in greater detail below. The control logic 609 is also adapted to truncate overlapping match lengths from parallel contiguous segments 603$_0$ to 603$_P$ as required.

Although match sequences are truncated at segment boundaries, the inventors have found that in practice a large percentage of match sequences (typically 97%) have lengths below 16 bytes. The distribution of match sequences is massively skewed towards short match lengths with a "long tail". As a consequence, the probability of a match sequence hitting a segment boundary is quite low, and thus only has a negligible impact on the compression ratio. For example, for a 16384 byte history buffer, when using the standard Calgary Corpus data set the compression ratio reduces from 2.549 to 2.546, which is a negligible effect.

Figure 7:
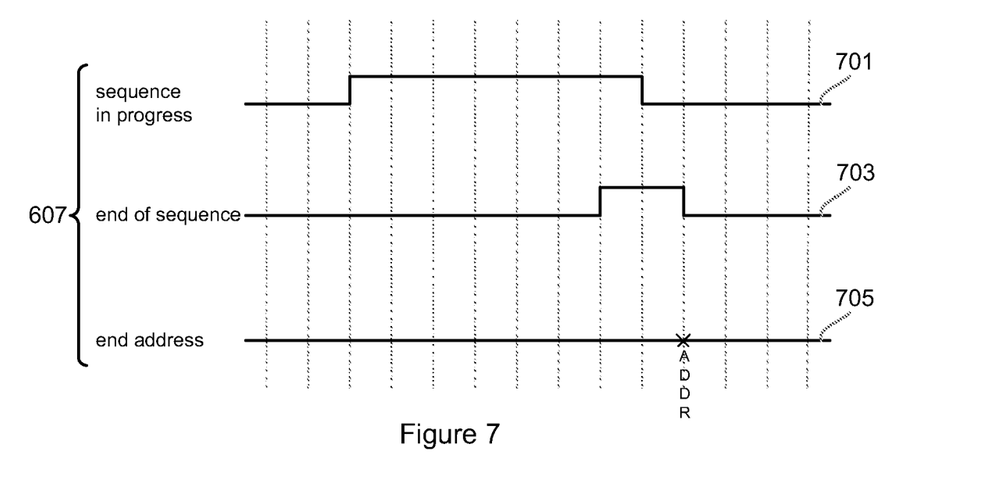
FIG. 7 shows an example of copy pointer signals that may be used with the implementation of FIG. 6.

FIG. 7 shows an example of the copy pointer signals 607 that may be generated by each contiguous segment 603$_0$ to 603$_P$ for processing by the control logic 609. The copy pointer signals 607 may comprise a "sequence in progress" signal 701, which indicates when a match sequence is in progress for a particular contiguous segment 603$_0$ to 603$_P$. An "end of sequence" signal 703 indicates when a match sequence within that particular contiguous segment has ended. An "end address" signal 705 corresponds to the copy pointer address for the match sequence that has ended for that particular contiguous segment.

Figure 8A:
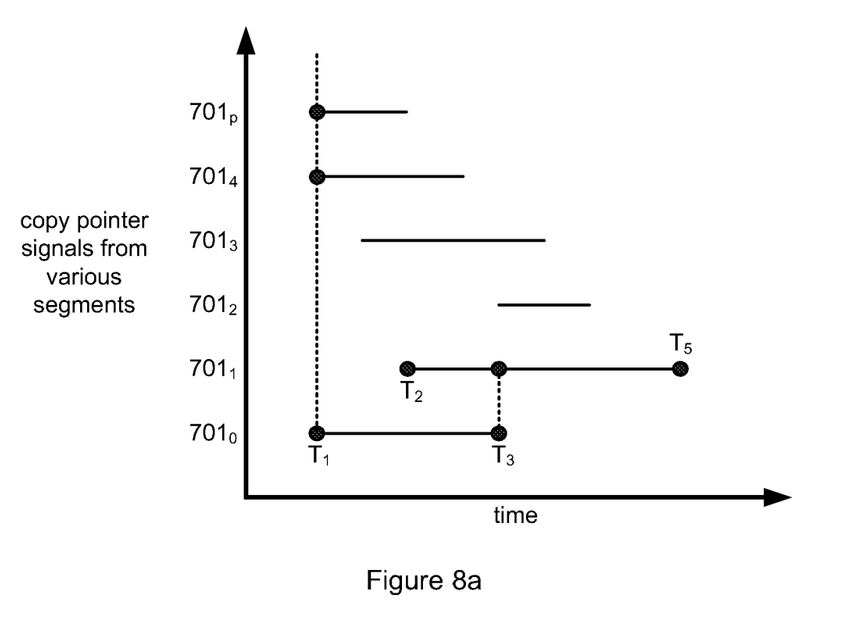
FIG. 8a further illustrates the copy pointer signals that may be used with the implementation of FIG. 6.

Referring to FIG. 8a, this illustrates the sequence in progress signals 701$_0$ to 701$_P$ that may be received by the control logic 609 from a plurality of respective contiguous segments 603$_0$ to 603$_P$. As can be seen, the sequence in progress signals 701$_0$ to 701$_P$ will start and end at different times for different contiguous segments 603$_0$ to 603$_P$. According to one implementation, the control logic 609 is configured to detect the longest match sequence, and provide copy pointers based on the detected longest match sequence. In such an implementation, in the example of FIG. 8a the control logic 609 is configured to detect that the sequence in progress signal 701$_1$ (i.e. from contiguous segment 603$_1$) has the longest match sequence, i.e. from T2 to T5, and provide copy pointers based on this match sequence.

According to another implementation, the control logic may be configured to detect the first match, or multiple matches if more than one match sequence commences at the same time, and then continue selecting whichever one of these matches lasts the longest. When the match ends (or the longest match ends in the case of multiple matches), the control logic 609 may be configured to check whether there is another match (or matches) in progress, or commencing, on another of the continuous segments $603_0$ to $603_p$, i.e. by monitoring the sequence in progress signals $701_0$ to $701_p$. The control logic can be configured to continue selecting such a match or matches. In the event that multiple matches are already in sequence and/or commencing, the control logic 609 can be configured to select the longest match until that match ends. This process can be repeated until such time as there are no longer any matches in progress, or commencing, on another contiguous segment when the current match being monitored ends. For example, in the example of FIG. 8a, at point T1 match sequences commence on sequence in progress signals $701_0$, $701_4$ and $701_p$. The control logic is configured to monitor these match sequences that are in progress and continue with the longest match, i.e. the match $701_0$, until time T3.

Once the control logic 609 has determined that the longest match has ended, i.e. sequence in progress signal $701_0$ completed at time T3), the control logic 609 checks whether any other matches are currently in progress on the other contiguous segments, and in the example determines that sequence in progress signals $701_1$, $701_2$ and $701_3$ meet this criteria. The control logic monitors each of these matches and continues with the longest one of these match signals, i.e. T3 to T5 of sequence in progress signal $701_1$ in FIG. 8a.

This sequence of operations can continue at time T5, whereby the control logic 609 determines whether any other matches are currently in progress in any one or more of the plurality of other contiguous segments $603_0$ to $603_p$, until such time as no other matches in progress are found. In the example of FIG. 8a the operation ends at time T5, since no other matches are in progress in any of the other contiguous segments $603_0$ to $603_p$ at this time.

Since the sequence in progress signal $701_0$ was already in progress (i.e. from time T1 to T3) when the sequence in progress signal $701_1$ matches from time T2 to T5, the copy pointer for signal in progress signal $701_1$ is truncated to T3-T5.

As such, the resultant copy pointers for the example in FIG. 8a are T1→T3 for contiguous segment $603_0$, and T3→T5 for contiguous segment $701_1$. The system therefore stores or buffers information relating to any active match that is taking place in any of the plurality of contiguous segments. This is because the system does not know at any point in time whether a particular match sequence is going to form part of the "overall" match sequence. In an extreme case, all segments could be matching simultaneously, for example if the history buffer was all zeros, and more zeros were received.

Figure 8B:
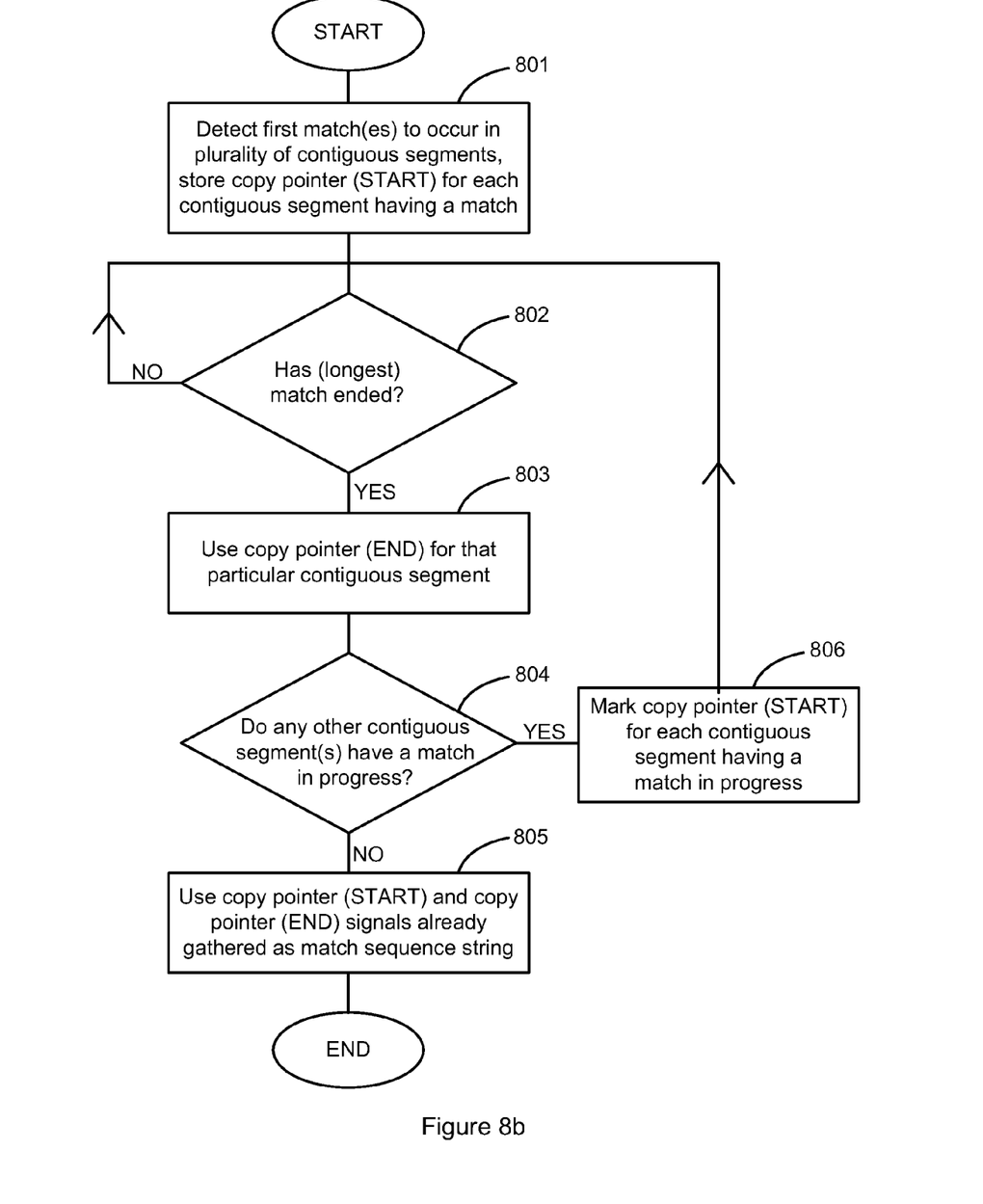
FIG. 8b shows an example of the method steps that may be performed by the control logic of FIG. 6.

FIG. 8b shows the method steps performed by the control logic 609 in further detail.

In step 801 the control logic 609 is configured to detect a first match or matches to occur in the plurality of contiguous segments, and store a copy pointer (START) for each contiguous segment having a match. In step 802 the control logic 609 is configured to monitor whether the match has ended. In the case where multiple matches were detected in step 801, this involves monitoring when the longest of such matches has ended. When the match or longest match has ended, in step 803 the control logic is configured to use a copy pointer (END) for that particular contiguous segment. The control logic 609 then checks in step 804 whether any of the other of the plurality of contiguous segments have a match in progress. If not, the copy pointer (START) and copy pointer (END) already obtained are used as the copy pointer signals.

However, if it is determined in step 804 that one or more of the other contiguous segments does have a match sequence in progress (or commencing), then that point in time is used as a copy pointer (START) signal for each of such matches, step 806. As such, any contiguous segments already having a match in progress will have its original copy pointer (START) signal truncated to the new copy pointer (START) signal determined in step 806. In the example of FIG. 8a, this can be seen with signal $701_1$ having its original copy pointer (START) signal T2 being truncated to a copy pointer (START) signal T3.

The procedure above is then repeated in steps 802, 803, 804 and 806 until such time as there are no other matches in progress or commencing when a particular match comes to an end in step 804, in which case processing moves to step 805 where the already gathered copy pointer (START) and copy pointer (END) signals for each relevant contiguous segment are used as the copy pointer signals.

Figure 8C:
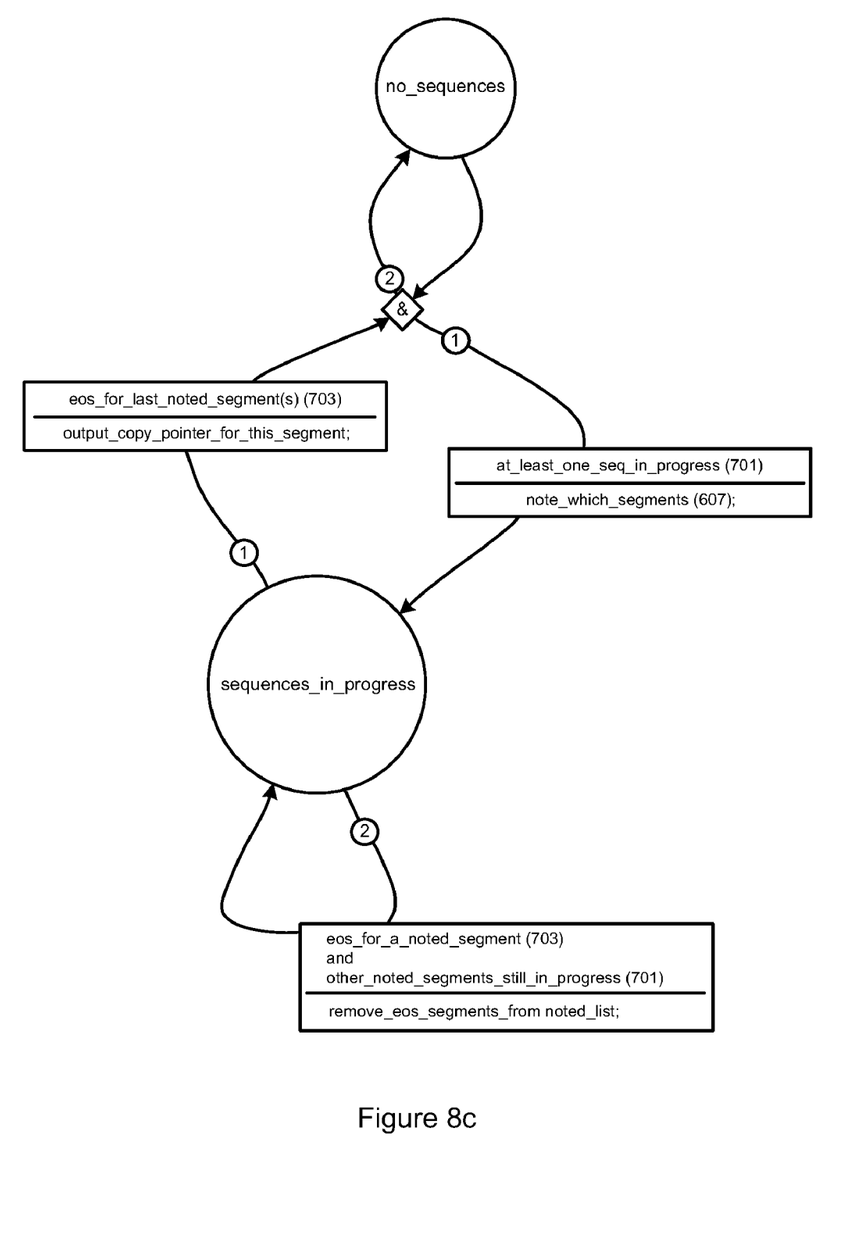
FIG. 8c is a state machine further describing an implementation.

FIG. 8c shows a state diagram corresponding to the operations described above. The reading of the state diagram will be clear to a person skilled in the art, using the syntax and actions explained below:

In each transition "box", the text above the line is the event that triggers the transition, the text below the line is the action that occurs on each transition, "seq"=sequence of consecutive matches, "eos"=end of sequence, i.e. the last match in a sequence, "noted list"=a list of sequences that were output from contiguous segments 603, and recorded in transition action 607.

Figure 9A:
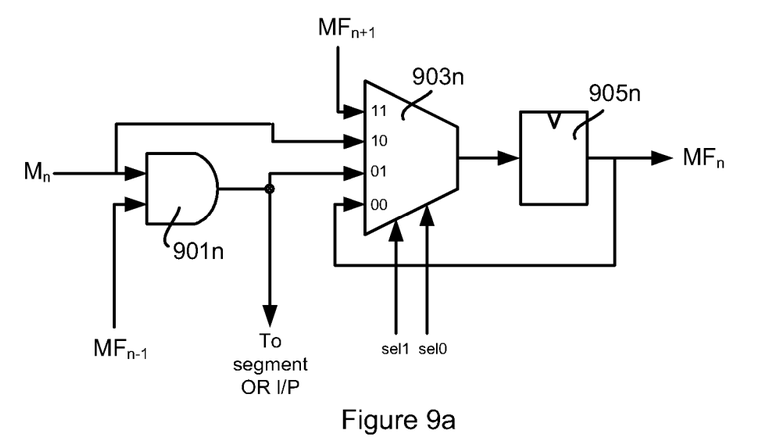
FIG. 9a shows an example of combinatorial logic that may be used with the implementation of FIG. 6.

FIG. 9a shows an example of the combinatorial logic that may be used to generate a match flag $MF_n$ for one memory location in the history buffer. It is noted that the implementations described herein are not limited to the combinatorial logic described in FIG. 9a, and that other combinatorial logic for detecting a match flag may be used.

The combinatorial logic shown in FIG. 9a comprises an AND gate $901_n$ coupled to receive a match signal $m_n$ from match line "n" on a first input (i.e. the match line being processed), and a match flag $MF_{n-1}$ from a preceding match line n−1 on a second input. The output of the AND gate $901_n$ is coupled to a multiplexer $903_n$ as described below. Furthermore, the output of the AND gate $901_n$ is coupled to an OR gate 909 (described below in relation to FIG. 9b), the OR gate 909 coupled to receive a plurality of outputs corresponding to other AND gates $901_n$ in a particular contiguous segment.

The multiplexer $903_n$ is coupled to receive the following input signals:

the output of the AND gate $901_n$ the match signal $m_n$ from match line n a match flag $MF_{n+1}$ from a succeeding match line n+1 a feedback of the match flag $MF_n$ from the current match line n

The multiplexer 903 is configured to pass one of the input signals according to the status of control signals "sel1" and "sel0". For example, the multiplexer $903_n$ may be configured to pass the input signals according to the truth table shown below:

| Sel1 | Sel0 | input signal being passed |
|------|------|---------------------------|
| 1 | 1 | Match Flag MFn + 1 |
| 1 | 0 | Match signal Mn |
| 0 | 1 | Result of (Mn AND MFn − 1) |
| 0 | 0 | Match Flag MFn |

The output of the multiplexer is latched using a latch $905_n$, the output of which provides the match flag $MF_n$.

Figure 9B:
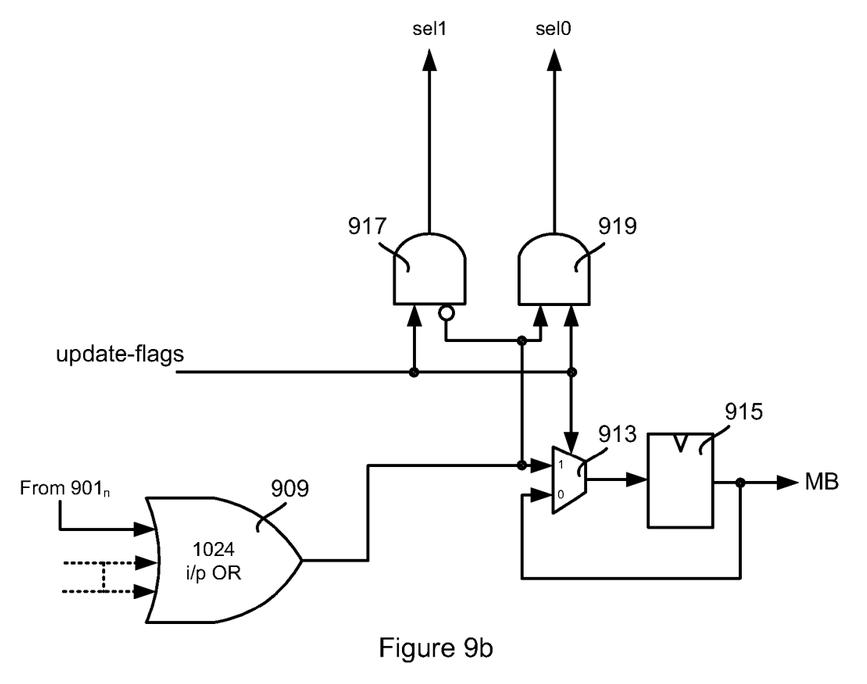
FIG. 9b shows a further example of combinatorial logic that may be used with the implementation of FIG. 6.

FIG. 9b shows an example of the combinatorial logic that may be used to generate the control signals sel1 and sel0 for a particular contiguous segment. Such circuitry exists for each segment, and it is therefore noted that the 1024 inputs to the OR gate 909 are merely an example corresponding to how a history buffer having 16383 bytes, for example, may be split into 16 segments. It is noted that the implementations described herein are not limited to the combinatorial logic described in FIG. 9b, and that other combinatorial logic for producing the control signals sel1 and sel0 may be used.

Referring to FIG. 9b, an OR gate 909 is coupled to receive a plurality of output signals from respective AND gates $901_n$ for a particular contiguous segment $603_0$ to $603_P$. The output of the OR gate 909 is coupled to a first input of a multiplexer 913. The output of the multiplexer 913 is coupled to a latch 915, the output of which provides a multibyte signal MB. The multibyte signal MB is fed back to a second input of the multiplexer 913. The multiplexer 913 is controller by an enable signal "update-flags", which is also coupled to a first input of an AND gate 919. The second input of the AND gate 919 is coupled to receive the output of the OR gate 909. An AND gate 917 is coupled to receive an inverted output of the OR gate 909 on a first input, and the control signal update-flags on a second input.

The output of the AND gate 917 generates the control signal sel1, and the output of AND gate 919 generates the control signal sel0.

The implementations described above have the advantage of enabling higher transfer rates with improved compression ratios to be achieved using cost effective ASIC hardware.

The implementations can also be applied retrospectively to existing products for cost saving or improved speed performance.

Although the implementations have been described using certain logic gates to provide a desired function, it will be appreciated that other logic gates may be used which are configured differently, while providing the same logic function, without departing from the scope of the appended claims.

As such, it should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A history buffer for use in adaptive lossless data compression, the history buffer comprising:
    a plurality of memory locations partitioned into two or more segments, each segment to detect a match sequence independently of the other segments; and
    control logic to:
        select a first match sequence, detected at a first one of the segments, and a second match sequence detected at a second one of the segments; and
        truncate the second match sequence if the first and second match sequences overlap.

2. A history buffer as claimed in claim 1, wherein each segment is configured to detect a match sequence in parallel with one or more of the other segments.

3. A history buffer as claimed in claim 1, wherein each segment is configured to process an equal number of memory locations of the history buffer.

4. A history buffer as claimed in claim 1, wherein at least two of the segments are configured to process a different number of memory locations of the history buffer.

5. A history buffer as claimed in claim 1, wherein the control logic is further to determine that more than one match sequence is in progress concurrently at more than one of the segments, respectively, determine the longest of such match sequences, and select the longest match sequence as the first match sequence.

6. A history buffer as claimed in claim 1, wherein the control logic is further to determine, at the end of the first match sequence, whether another match sequence is currently in progress on another one of the segments.

7. A history buffer as claimed in claim 1, wherein the control logic is to truncate the second match sequence based on where the first and second match sequences overlap.

8. The history buffer of claim 1, wherein each of the segments is to detect a commencement and an end of a match sequence independently of the other segments.

9. A method of using a history buffer for adaptive lossless data compression, wherein the history buffer comprises a plurality of memory locations partitioned into a plurality of segments, the method comprising:
    detecting, with a first one of the segments, a commencement and end of a first match sequence independent of any other of the segments;
    detecting, with a second one of the segments, a commencement and end of a second match sequence independent of any other of the segments;
    selecting the first and second match sequences; and
    truncating the second match sequence if the first and second match sequences overlap.

10. A method as claimed in claim 9, further comprising:
    detecting the first match sequence at the first segment and the second match sequence at the second segment in parallel.

11. A method as claimed in claim 9, further comprising:
    detecting a plurality of match sequences commencing concurrently at a plurality of the segments;
    determining the longest match sequence of the plurality of match sequences; and
    selecting the longest match sequence as the first match sequence.

12. A method as claimed in claim 9, wherein the truncating comprises:
    truncating the second match sequence based on where the first and the second match sequences overlap.

13. The method of claim 9, wherein the first and second match sequences have different lengths.

14. The method of claim 9, further comprising:
    determining, in response to the end of the first match sequence at the first segment, that a plurality of other match sequences are in progress at respective segments of the plurality of segments at the time of the end of the first match sequence;

determining which of the plurality of other match sequences is the longest, after each of the plurality of other match sequences has ended; and selecting the match sequence determined to be the longest as the second match sequence.

15. An apparatus comprising:

a plurality of history buffer segments, each to detect a match sequence independently of the other segments and based on a respective plurality of memory locations, wherein each of the history buffer segments comprises:

a plurality of match flag logic units, each to generate a comparison output in accordance with a comparison of incoming information with information at a respective one of the memory locations associated with the history buffer segment; and     combinatorial logic to generate a result based on the comparison outputs of each of the match flag logic units,     wherein each match flag logic unit is further to generate a match flag in accordance with the result generated by the combinatorial logic.

16. The apparatus of claim 15, wherein each of the segments is to:

output a sequence in progress signal if a match sequence is being detected by the segment; and output an end of sequence signal in response to detecting the end of the match sequence.

17. The apparatus of claim 15, further comprising control logic to:

detect a commencement of a first match sequence at a first one of the segments; and determine, in response to the end of the first match sequence at the first segment, whether a second match sequence is being detected at a second one of the segments at the time of the end of the first match sequence.

18. The apparatus of claim 15, wherein the control logic is further to:

truncate the second match sequence if the second match sequence overlaps the first match sequence.

19. The apparatus of claim 15, further comprising control logic to:

detect commencement of a plurality of match sequences at respective segments of the plurality of segments; and determine which of the plurality of match sequences is the longest after each of the plurality of match sequences has ended.

20. The apparatus of claim 15, wherein each of the segments is to detect a commencement and an end of a match sequence independently of the other segments.

* * * * *